(12) United States Patent
Thompson et al.

(10) Patent No.: US 6,597,110 B1
(45) Date of Patent: Jul. 22, 2003

(54) TITANIUM NITRIDE ANODE FOR USE IN ORGANIC LIGHT EMITTING DEVICES

(75) Inventors: Mark E. Thompson, Anaheim, CA (US); Vadim Adamovich, Los Angeles, CA (US); Andrei Shoustikov, Los Angeles, CA (US)

(73) Assignee: The University of Southern California, Los Angeles, CA (US)

( * ) Notice: Subject to any disclaimer, the term of this patent is extended or adjusted under 35 U.S.C. 154(b) by 0 days.

(21) Appl. No.: 09/568,336

(22) Filed: May 10, 2000

Related U.S. Application Data

(60) Provisional application No. 60/134,242, filed on May 13, 1999.

(51) Int. Cl.$^7$ ............................................... H05B 33/00
(52) U.S. Cl. ...................... 313/506; 313/503; 313/504
(58) Field of Search ................................ 313/506, 503, 313/504; 428/690, 917; 315/169.3

(56) References Cited

U.S. PATENT DOCUMENTS

| | | | |
|---|---|---|---|
| 5,294,870 A | | 3/1994 | Tang et al. |
| 5,703,436 A | | 12/1997 | Forrest et al. |
| 5,707,745 A | | 1/1998 | Forrest et al. |
| 5,757,026 A | | 5/1998 | Forrest et al. |
| 5,952,778 A | | 9/1999 | Haskal et al. |
| 5,969,474 A | | 10/1999 | Arai |
| 5,981,092 A | | 11/1999 | Arai et al. |
| 6,118,212 A | * | 9/2000 | Nakaya et al. ............... 313/503 |
| 6,399,222 B2 | * | 6/2002 | Arai et al. .................. 313/504 |

OTHER PUBLICATIONS

J. N. Musher et al., "Atmospheric Pressure Chemical Vapor Deposition of Titanium Nitride from Tetrakis (diethylamido) Titanium and Ammonia," *Journal of Electrochemical Society*, vol. 143, No. 2, Feb. 1996, pp. 736–744.

J.N. Musher et al., "Atmospheric pressure chemical vapor deposition of TiN from tetrakis (dimethylamido) titanium and ammonia," *1996 Materials Research Society*, vol. 11, No. 4, Apr. 1996, pp. 989–1001.

P. J. Martin et al., "Optical properties of $TiN_x$ produced by reactive evaporation and reactive ion–beam sputtering," *Vacuum*, vol. 32, No. 6, pp. 359–362 (1982).

* cited by examiner

*Primary Examiner*—Ashok Patel
(74) *Attorney, Agent, or Firm*—Kenyon & Kenyon

(57) ABSTRACT

An organic light emitting device ("OLED"), including a substrate, a conductive nitride electrode, an organic film, and a second conductive electrode. The conductive nitride films can be transparent or opaque depending on their thickness. The OLEDs provide high brightness and efficiency and can be incorporated into electronic devices, including computers, monitors, televisions, large area wall screens, theater screens, stadium screens, billboards, signs, vehicles, printers, telecommunications devices, and telephones.

7 Claims, 5 Drawing Sheets

TITANIUM NITRIDE ANODE FOR USE IN ORGANIC LIGHT EMITTING DEVICES

This application claims the benefit of U.S. Provisional Patent Application Serial No. 60/134,242, filed May 13, 1999.

FIELD OF THE INVENTION

This invention relates to the use of conductive nitrides, particularly TiN, as electrode material in organic light emitting devices.

BACKGROUND OF THE INVENTION

Organic light emitting devices (OLEDs), which make use of thin film materials that emit light when excited by electric current, are becoming an increasingly popular form of flat panel display technology for applications such as television sets, computer terminals, telecommunications equipment and a host of other applications. There are presently three predominant types of OLED construction: the "double heterostructure" (DH) OLED, the "single heterostructure" (SH) OLED, and the single layer polymer OLED.

In the DH OLED, as shown in FIG. 1A, a substrate layer of glass 10 is coated by a thin layer of indium-tin-oxide (ITO) 11. Next, a thin (100–500 Å) organic hole transporting layer (HTL) 12 is deposited on ITO layer 11. Deposited on the surface of HTL 12 is a thin (typically, 50Å–500Å) emission layer (EL) 13. The EL 13 provides the site for electrons injected from a 100–500Å thick electron transporting layer 14 (ETL) to recombine with holes from the HTL 12. Examples of prior art ETL, EL and HTL materials are disclosed in U.S. Pat. No. 5,294,870, the disclosure of which is incorporated herein by reference.

Often, the EL 13 is doped with a highly fluorescent dye to tune color and increase the electroluminescent efficiency of the OLED. The device as shown in FIG. 1A is completed by depositing metal contacts 15, 16 and top electrode 17. Contacts 15 and 16 are typically fabricated from indium or Ti/Pt/Au. Electrode 17 is often a dual layer structure consisting of an alloy such as Mg/Ag 17' directly contacting the organic ETL 14, and a thick, high work function metal layer 17" such as gold (Au) or silver (Ag) on the Mg/Ag. The thick metal 17" is opaque. When proper bias voltage is applied between top electrode 17 and contacts 15 and 16, light emission occurs from emissive layer 13 through the glass substrate 10. An LED device of FIG. 1A typically has luminescent external quantum efficiencies of from 0.05% to 2% depending on the color of emission and the device structure.

The (SH) OLED, as shown in FIG. 1B, makes use of multi-functional layer 13' to serve as both EL and ETL. One limitation of the device of FIG. 1B is that the multi-functional layer 13' must have good electron transport capability.

A single layer polymer OLED is shown in FIG. 1C. As shown, this device includes a glass substrate 1 coated by a thin ITO layer 3. A thin organic layer 5 of spin-coated polymer, for example, is formed over ITO layer 3, and provides all of the functions of the HTL, ETL, and EL layers of the previously described devices. A metal electrode layer 6 is formed over organic layer 5. The metal is typically Mg or other conventionally used low work function metal.

The choice of materials to be used in OLEDs is based on several criteria. For example, the anode in a conventional OLED must have good optical transparency, good electrical conductivity and chemical stability. Indium tin oxide (ITO) meets these criteria and is the most widely used anode material in OLEDs. ITO films combine high transparency ($\approx$90%) with low resistivity ($1\times10^{-3}$–$7\times10^{-5}$ $\Omega\cdot$cm) and can be prepared by a variety of methods including sputtering, chemical vapor deposition (CVD) and sol-gel techniques.

However, OLEDs using ITO films do have a few areas which could be improved upon. First, the work function of ITO (4.4–4.7 eV, based on ultraviolet photoemission spectroscopy measurements) lies near the HOMO levels of typical OLED hole transporting or injecting materials, thus leading to a barrier for hole injection into organic material. Second, an OLED's stability and efficiency strongly depend on the nature of the anode/organic film interface. Therefore, any changes in this interface over time will destabilize the OLED. For example, one cause of long term OLED degradation involves the diffusion of metal ions or oxygen from the ITO film into the organic film. Finally, another issue arising from the use of an ITO anode is the tendency of $SnO_x$ and $InO_x$ islands to form through reorganization of the ITO film over time.

Therefore, although ITO electrodes have been used with many different organic materials, additional OLED anode materials are needed.

SUMMARY OF THE INVENTION

The present invention provides organic light emitting devices, including polymer, (e.g. single and multi-layer), single heterostructure, and double heterostructure, which use conductive nitride films as anode material. These anode layers can be transparent or opaque and can be used in OLEDs with transparent cathodes. In addition, the formed OLEDs with TiN or TiN/ITO anode layers can be used to form stacked OLEDs.

The OLEDs of the present invention can be incorporated in electronic devices, including computers, monitors, televisions, large area wall screens, theater screens, stadium screens, billboards, signs, vehicles, printers, telecommunication devices, and telephones.

One embodiment of the present invention comprises forming a thin TiN film on a glass substrate and then forming an OLED using the TiN film as an anode layer. Another embodiment of the present invention uses a multi-layered anode of TiN on top of ITO in forming an OLED.

DETAILED DESCRIPTION

Figure 1A:
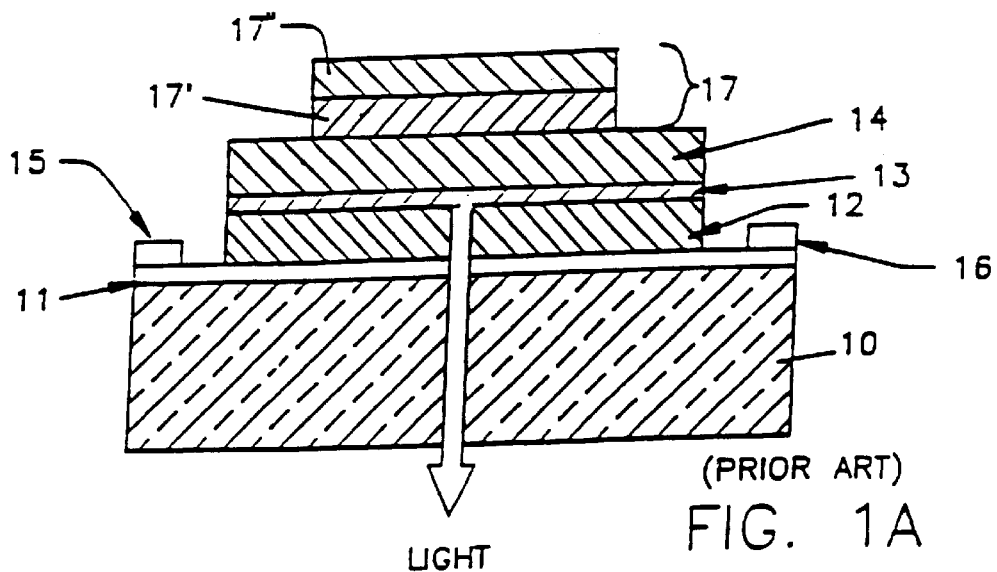
FIG. 1A is a cross sectional view of a typical organic double heterostructure light emitting device (OLED) according to the prior art.
Figure 1B:
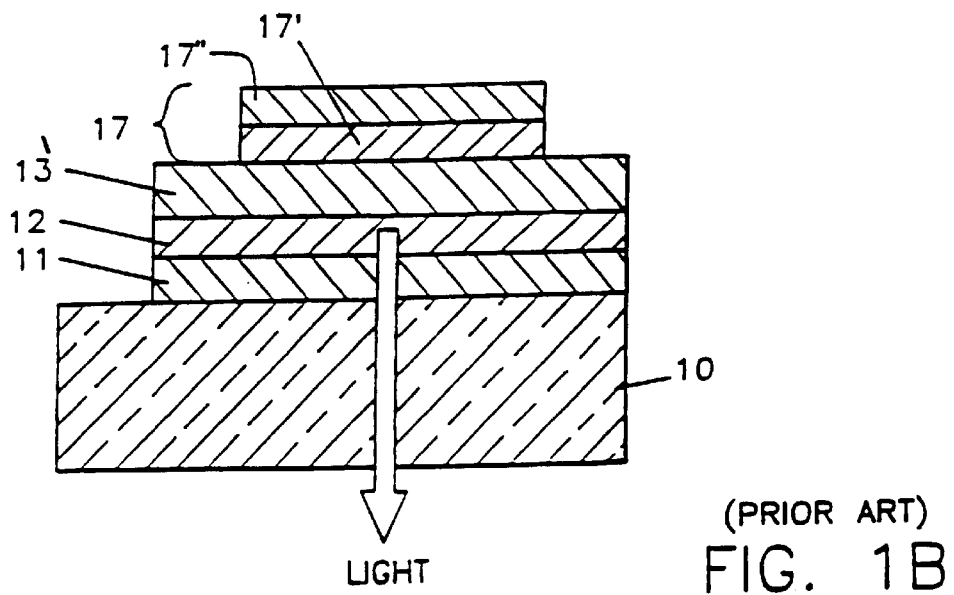
FIG. 1B is a cross sectional view of a typical organic single heterostructure light emitting device (LED) according to the prior art.
Figure 1C:
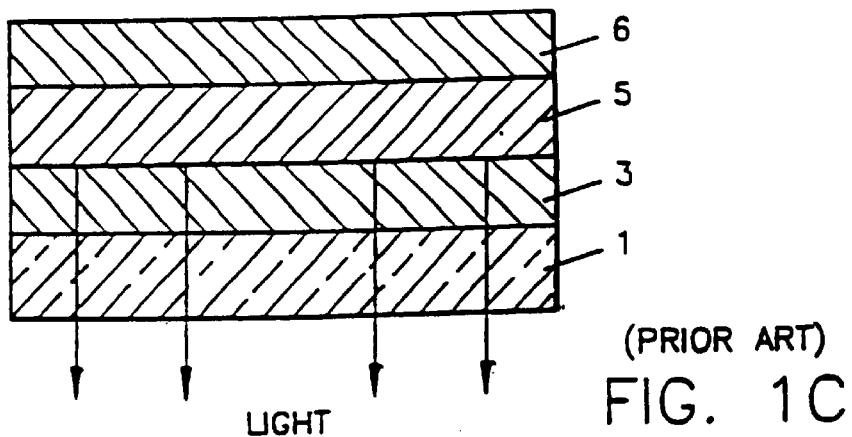
FIG. 1C is a cross sectional view of a known single layer polymer LED structure according to the prior art.

The present invention provides light emitting devices that use conductive nitrides as anode material. The present invention's conductive nitride anodes can be transparent or opaque depending on the thickness of the anode film/layer. In addition, these conductive nitride anodes can be used with transparent cathodes.

While the illustrative embodiments below speak in terms of titanium nitride, it should be understood that any conductive nitride may be used. Furthermore, while the illustrative embodiments below speak in terms of single heterostructure OLEDs, it should be understood that any type of OLED (e.g. polymer (single and multi-layered), single heterostructure, or double heterostructure) may be formed.

First Embodiment

In a first embodiment of the present invention, small molecule based OLEDs were prepared on glass substrates having varying TiN thickness layers. OLEDs with ITO anodes were also made for comparison. In each experiment two devices were made at the same time, (i.e., the organic and metal films were deposited on both substrates at the same time) one ITO/α-NPD/Alq$_3$/Mg—Ag device used as a reference device and one TiN/α-NPD/Alq$_3$/Mg—Ag device. The purpose of making the devices at the same time was so that the only difference between the devices would be the anode layers. The OLEDs consisted of a 400 Å hole transporting layer (αNPD), a 500 Å electron transporting layer (Alq$_3$) and a 10:1 Mg/Ag cathode of 800–1,000 Å thus forming either TiN/NPD/Alq$_3$/Mg—Ag or ITO/NPD/Alq$_3$/Mg—Ag. The organic materials were deposited as uniform sheets, while the Mg/Ag cathodes were deposited as 1 mm diameter dots.

The TiN films were prepared by atmospheric pressure metalorganic CVD from tetrakis(dimethylamido)titanium (TDMAT) [(CH$_3$)$_2$N]$_4$Ti and ammonia and deposited onto glass substrates. The TiN film preparation process used is similar to the one reported by Joshua N. Musher and Roy G. Gordon in *J. Mater. Res.*, 1996, 11(4) 736–744.

To form the TiN films, TDMAT (technical grade) from Aldrich Chemical Company was purified by vacuum distillation. Semiconductor purity ammonia was mixed with ultra high purity (UHP) nitrogen in a ratio of 1.2:1 (by volume) and fed into a laminar flow CVD reactor (4 inch diameter tube furnace) heated to 150° C. The glass substrate was mounted on a surface heater placed in the center of the CVD furnace and heated to between 300 and 400° C. UHP nitrogen was bubbled through liquid TDMAT at 65° C. and the resulting TDMAT saturated nitrogen stream was injected into the CVD reactor through a nozzle near the substrate. During the deposition, the nozzle was moved along the substrate surface, leading to uniform films roughly 2 cm×2 cm in area. The deposition time to produce a 50–200 Å TiN film was no more than 2 minutes.

The compositions of the obtained TiN films were analyzed by x-ray diffraction, TEM Energy Dispersive X-ray analysis (EDX), and Auger Electron Spectroscopy (AES). The thickness of the films was determined by ellipsometry using 632 nm laser light (n=1.5 and k=1.75 for TiN at this wavelength, P. J. Martin, R. P. Netterfield, and W. G. Sainty. Vacuum, 1982, 32(6) 359–362), AES depth profile, and light absorption. SEM was also used to determine the thickness of the TiN film. The uniformity and roughness of the films were checked by SEM and atomic force microscopy (AFM). In addition, the electrical resistivity of the films was measured by a four-point probe method.

The TiN films prepared by atmospheric pressure metalorganic CVD had a silver-bluish color in reflected light and ranged from light brown to greenish in color in transmitted light (transmittance 80–50% for films of 50–200 Å). The TiN films were near stoichiometric, containing a small amount of oxygen (approximately 5% or less) and carbon (approximately 5% or less) based on EDX and AES. The x-ray diffraction pattern of the TiN samples was consistent with that reported for Ti$_{1.0}$N$_{1.0}$ and the resistivity of these films ranged from approximately 400–500 $\mu\Omega$-cm.

Sheet resistances were measured for the TiN films and varied depending on film thickness as shown in Table 1. TiN films of 900–1000 Å thickness typically have sheet resistances of approximately 40 $\Omega$/☐ (ohms per dimensionless value), which is lower than ITO films of the same thickness.

The ITO on glass (100 $\Omega$/☐) and TiN on glass substrates were first cleaned in boiling 1,1,1-trichloroethane and then in acetone for 3–4 minutes followed by sonication in isopropanol for 2 minutes. After this cleaning procedure, the substrates were dried under a N$_2$ flow.

The background pressure in the deposition system prior to OLED fabrication was normally 6×10$^{-6}$ Torr, and the pressure during film deposition was between 6×10$^{-6}$ and 1×10$^{-5}$ Torr. The compounds used for fabrication of the OLEDs were evaporated from resistively heated tantalum boats onto the substrates at room temperature. 4,4'-Di(phenyl-α-napthylamino)biphenyl (αNPD) and aluminum-tris(8-quinoloxide) (Alq$_3$) were deposited successively at a rate of 0.8–2 Å/sec to give film thicknesses of approximately 400 Å and 500 Å, respectively. After deposition of the organic films, the chamber was vented and a shadow mask was put onto the substrates to pattern the cathodes as 1 mm diameter dots. Magnesium and silver were then co-deposited at a rate of 2 Å/s for magnesium and 0.15–0.2 Å/s for silver. The corresponding ratio of Mg:Ag was approximately 10:1. The thickness of the cathode layer was approximately 800–1000 Å.

The devices were characterized in air within 4 h of fabrication. Current-voltage measurements were made with a Keithley source meter (model 2400). Light intensity was measured using a Newport model 1835 optical power meter and silicon radiometer. EL spectra were measured with a Photon Technology International fluorimeter. Optical transmittance at 632 nm was also measured using a HeNe laser and photodetector.

The TiN thickness for each OLED tested was determined using the film absorptivity (1.5×10$^5$ cm$^{-1}$) and the transmittance of the TiN film immediately adjacent to the OLED, measured using a 632 nm laser and photodetector. The data for several devices are given in Table 1. The anode thicknesses for all of the TiN devices were significantly less than that of the ITO devices.

The usable range of TiN thickness is approximately 40–180 Å and the sheet resistance depending on thickness, ranges from approximately 200 to 1500 $\Omega$/☐. The light output of the devices can reach 10,000 Cd/m$^2$ or more.

Figure 3:
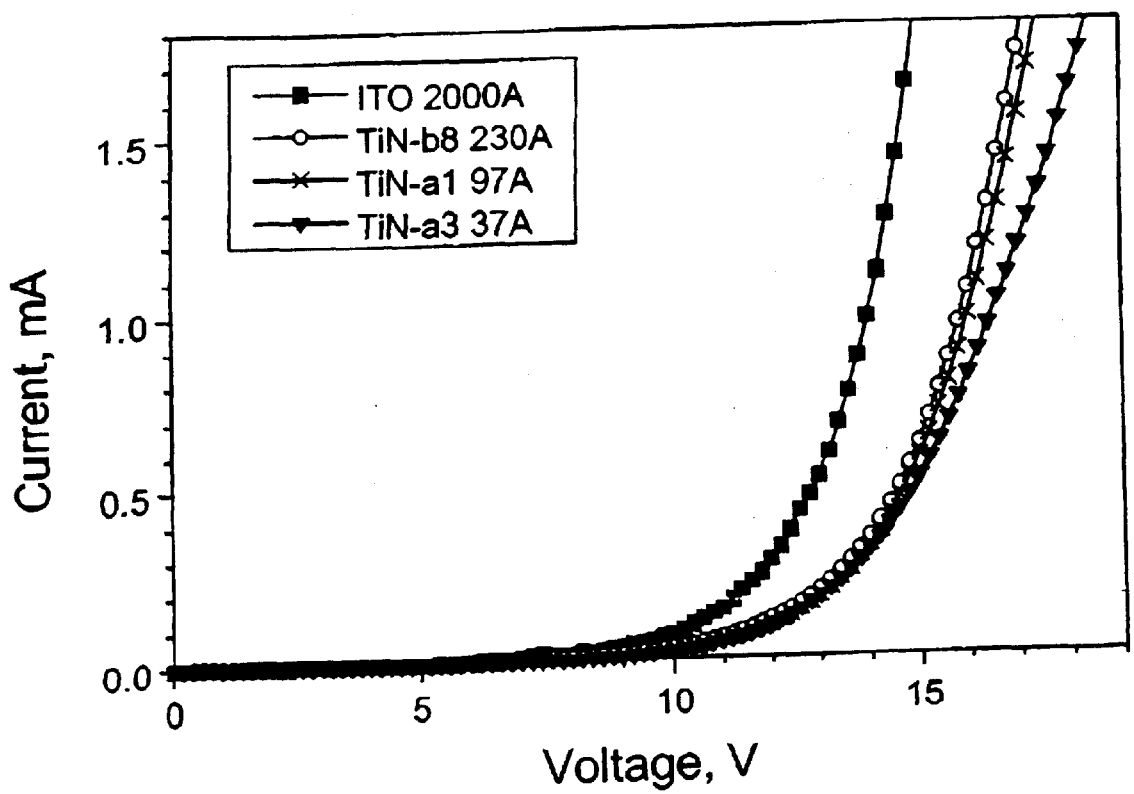
FIG. 3 is a current-voltage plot of TiN and ITO anode OLEDs.

FIG. 3 shows the current-voltage characteristics of some of the TiN OLEDs including an IV curve for one of the ITO device. The differences in the I–V characteristics of the individual TiN devices are attributed to the different thicknesses of the TiN films used in each device. This is seen in slightly higher drive voltages required for the TiN devices. For example, the drive voltage required to achieve 100 Cd/m$^2$ for the TiN OLEDs was typically 1 Volt higher than for the ITO anode OLEDs, (compare 10–10.5, and 9–9.5 V, respectively). These voltages are typically for OLEDs fabricated with 400 Å of NPD and 500 Å of Alq$_3$.

TABLE 1

| Device | Anode Thickness Å | Anode Sheet Resistance (Ω/□) | External quantum efficiency at 100 Cd/m², %[a] | External quantum efficiency, % | I, mA | Light output, Cd/m² | Corrected External quantum efficiency, % |
|---|---|---|---|---|---|---|---|
| TiN-a1 | 97 | 380 | 0.32 | 0.36 | 0.63 | 2,750 | 0.60 |
| TiN-a2 | 56 | 700 | 0.51 | 0.41 | 0.69 | 3,440 | 0.63 |
| TiN-a3 | 37 | 1,200 | 0.38 | 0.43 | 0.56 | 2,970 | 0.61 |
| TiN-a5 | ca. 25 | 160,000 | 0.17 | 0.44 | 0.14 | 762 | 0.52 |
| TiN-b6 | 93 | 850 | 0.22 | 0.27 | 0.49 | 1,600 | 0.42 |
| TiN-b7 | 185 | 260 | 0.18 | 0.21 | 0.40 | 1,000 | 0.45 |
| TiN-b8 | 230 | 190 | — | — | 0.61 | — | — |
| ITO-1 | 2,000 | 100 | 0.16 | 0.33 | 1.86 | 7,420 | — |
| ITO-2 | 2,000 | 100 | 0.23 | 0.35 | 2.29 | 9,640 | — |

[a]Voltages for TiN OLEDs were typically between 10–10.5 Volts, while ITO anode devices were 9–9.5 Volts.

Figure 2:
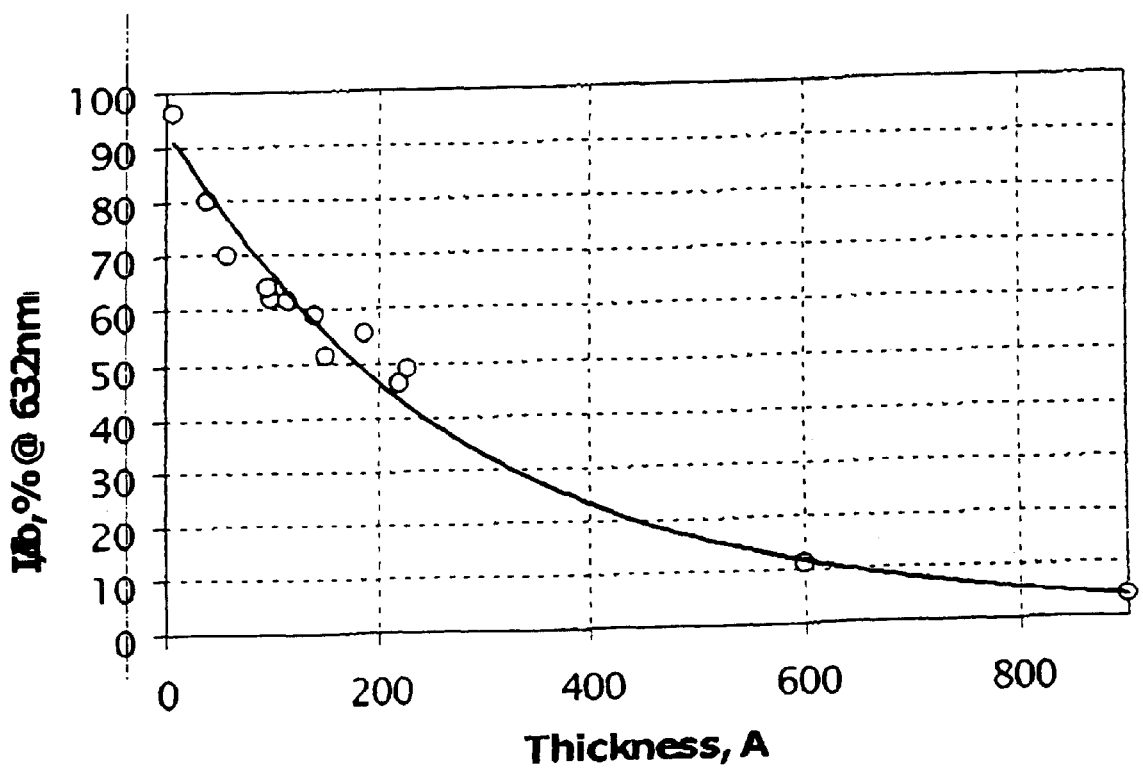
FIG. 2 is a graph of TiN film transmittance versus thickness in angstroms.
Figure 4:
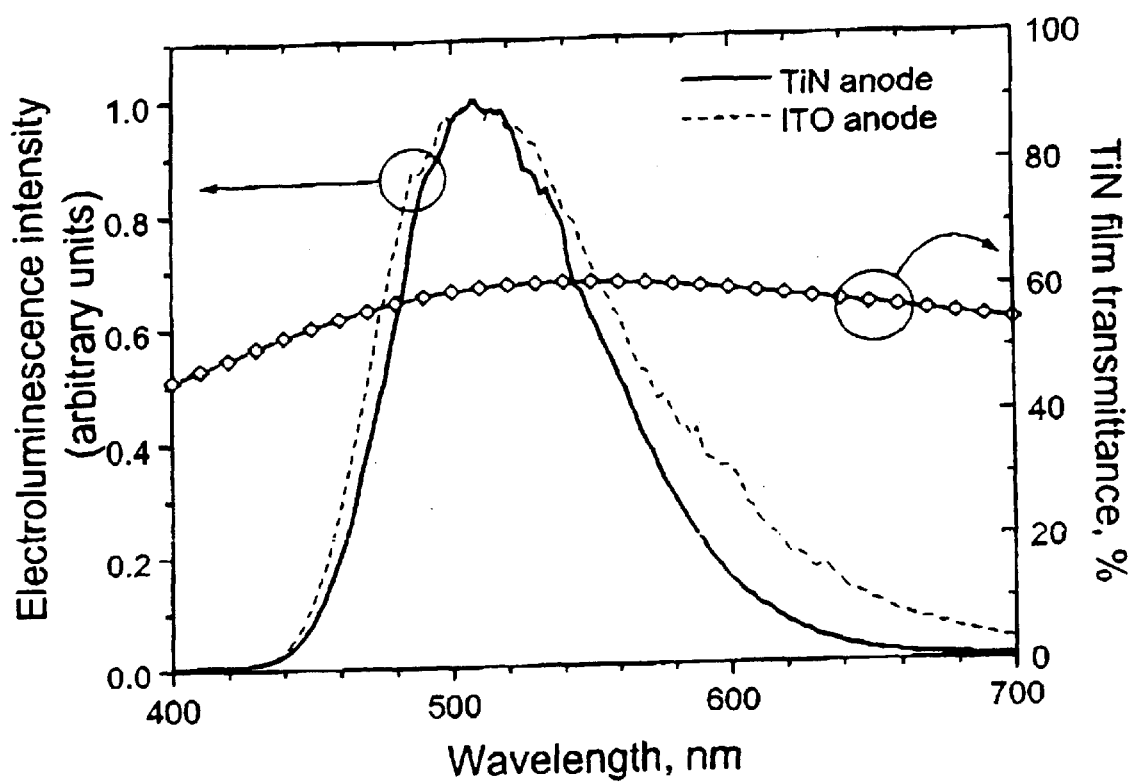
FIG. 4 is a graph of electroluminescence of TiN and ITO anode OLEDs and the transmittance of a TiN film.

Table 1 indicates that the quantum efficiencies for OLEDs with TiN <100 Å are better than the ITO devices. In Table 1, the quantum efficiencies for each device are listed both at a set brightness of 100 Cd/m² and at a fairly high brightness for each device (potential of 15 Volts for all devices). Table 1 shows that as the TiN films are made thicker the current-voltage characteristics improve, but the external quantum efficiencies decrease. The decreasing quantum efficiency is due to the increasing optical density of the anode as the TiN is made thicker, absorbing more of the electroluminescence. The transmittance spectrum of TiN is relatively flat, showing a maximum transmittance in the green part of the spectrum as shown in FIG. 4. The electroluminescence spectra of a TiN anode OLED and an ITO anode OLED are also shown in FIG. 4. Both spectra are consistent with exclusive emission from the $Alq_3$ layer, with very little difference in line shape and $\lambda_{max}$. The transmittance of the TiN films at 632 nm as a function of TiN film thickness is given in FIG. 2. The value of absorptivity determined from this data is $1.5 \times 10^5 cm^{-1}$. TiN films thicker than 200 Å typically have too high an optical density to make good transparent anodes for OLED applications.

The external quantum efficiencies can be corrected for the TiN anode absorption previously discussed. The corrected external quantum efficiency values shown in Table 1 were obtained by taking into account the absorption losses of light in the TiN films. The value of the external quantum efficiency of the devices with a TiN anode was divided by the coefficient αcalculated as:

$$\alpha = \frac{\int (El_{TiN} \times T_{TiN}) d\lambda}{\int (El_{std} \times T_{std}) d\lambda}$$

where
  El—electoluminescence intensity
  T—optical transmittance
  TiN—device with TiN (or TiN/ITO) anode
  std—standard reference device with ITO anode (transmittance assumed is equal 1).
  Therefore, α depends on the TiN's film thickness, for example, for a 185 Å TiN film, α would be 0.46.

The corrected quantum efficiency values for TiN OLEDs are significantly higher than for ITO based devices, averaging 0.6% for the TiN-bx set of devices, demonstrating that TiN can efficiently inject holes into standard organic hole transporting materials.

Second Embodiment

In a second embodiment of the present invention, TiN thin films are deposited onto ITO films formed on glass substrates. The multi-layered stack (TiN/ITO) is then used as anode material for forming OLEDs. While this embodiment of the present invention describes using ITO as part of the multi-layered anode, it should be recognized that TiN or any conductive nitride could be deposited on any transparent electrode film to form this multi-layered anode material.

Titanium nitride thin films on top of ITO used as anodes for OLEDs were prepared by atmospheric pressure metalorganic CVD from TDMAT and ammonia. The process described below for preparation of TiN is similar to Embodiment 1. TDMAT, technical grade, from Aldrich Chemical Company was purified by vacuum distillation. Semiconductor purity ammonia was mixed with UHP nitrogen in a ratio of 1.2:1 (by volume) and fed into a laminar flow CVD reactor (4 inch diameter tube furnace) heated to 150° C. The substrate (ITO coated glass with sheet resistance 100/□) was mounted on a surface heater placed in the center of the CVD furnace and heated to between 370 and 400° C. UHP nitrogen was bubbled through liquid TDMAT at 65–75° C. and the resulting TDMAT saturated nitrogen stream was injected into the CVD reactor through a nozzle near the substrate. During the deposition the nozzle was moved along the substrate surface, leading to uniform films roughly 2 cm×2 cm in area. Film thickness was controlled by the deposition time. The time to deposit a 50 Å TiN film was no more than 1 minute.

The composition, thickness, uniformity, roughness, and electrical resistivity were determined and checked in the same manner as described in Embodiment 1.

The resulting TiN film thicknesses ranged from approximately 20 to 350 Å and had a silver-bluish color in reflected light and ranged from light brown to greenish in color in transmitted light (transmittance 80–50% for films of 50–200 Å).

The present embodiment involved a 20–50 Å film of TiN on ITO. The TiN was near stoichiometric, containing a small amount of oxygen and carbon (ca. 5% or less) based on EDX and AES. The x-ray diffraction pattern of the TiN samples was consistent with that reported for $Ti_{1.0}N_{1.0}$. The resistivity of a TiN film of this thickness alone was 400–500 $\mu\Omega \cdot cm$. The sheet resistances measured for the TiN on ITO films varied depending on the TiN film thickness from 75 to 85 Ω/□. The ITO on glass (100 Ω/□) and TiN on ITO on glass substrates were cleaned in boiling trichloroethylene, acetone and isopropanol as described in Embodiment 1.

Figure 5:
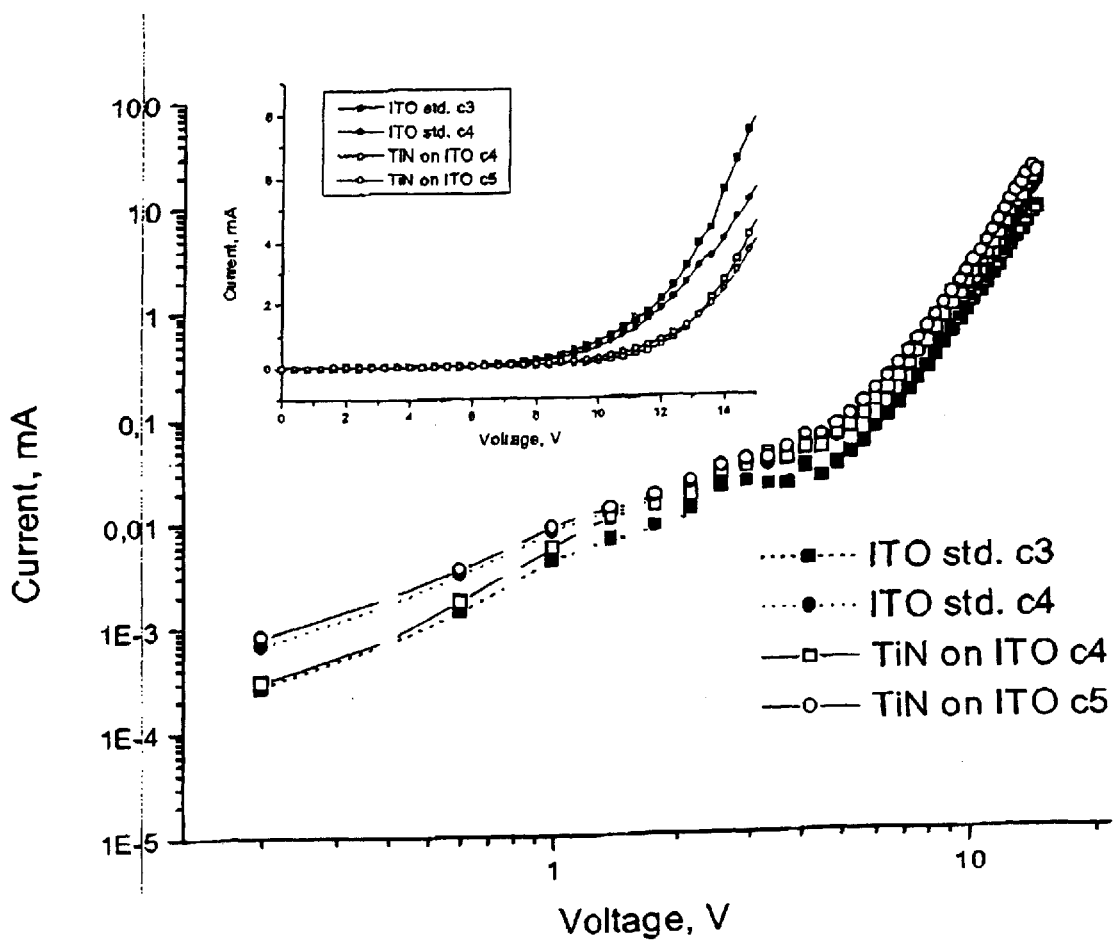
FIG. 5 is a current-voltage plot of TiN/ITO and standard ITO anode OLEDs.

OLEDs were then prepared as described in Embodiment 1 with both 1 and 2 mm cathodes. In each experiment two devices were made at the same time. One of them was an ITO/NPD/$Alq_3$/Mg—Ag/Ag device used as a reference and the other one was a ITO/TiN/NPD/Alq$_3$/Mg—Ag/Ag device. Table 2 shows experimental data for TiN/ITO anode OLEDs at a brightness of approximately 100 cd/m$^2$. The quantum efficiencies for both the ITO and TiN/ITO OLEDs are very similar, consistent with the thin TiN films having little impact on the electronic structure of the device. The voltage offset observed between the ITO and TiN/ITO devices is roughly 1 V, as shown in FIG. 5. This offset is significantly less than the 5–6 V offset that is observed for ITO versus TiN OLEDs.

TABLE 2

| Device # | V | I, mA | Q.E., % | Light, nW | Cd/m2 |
|---|---|---|---|---|---|
| diam 2 mm | | | | | |
| c8 | 8.6 | 0.10 | 0.35 | 804 | 101.4 |
| c7 | 9.2 | 0.09 | 0.39 | 801 | 101.1 |
| c5 | 8.8 | 0.12 | 0.31 | 860 | 108.4 |
| c4 | 9.0 | 0.08 | 0.43 | 840 | 105.9 |
| ITO std. C3 | 7.0 | 0.12 | 0.28 | 790 | 99.6 |
| ITO std. C4 | 7.2 | 0.11 | 0.32 | 798 | 100.6 |
| diam 1 mm | | | | | |
| b8 | 8.2 | 0.02 | 0.35 | 193 | 97.5 |
| b6 | 9.4 | 0.03 | 0.33 | 228 | 115.2 |
| b5 | 9.4 | 0.05 | 0.18 | 216 | 109.1 |
| ITO std. E2 | 7.0 | 0.03 | 0.33 | 209 | 105.6 |
| ITO std. D2 | 8.0 | 0.03 | 0.32 | 235 | 118.7 |
| ITO std. D3 | 7.8 | 0.03 | 0.35 | 212 | 107.1 |

Third Embodiment

In addition to the single OLED structure of the first and second embodiments, another embodiment of the invention comprises stacking at least two OLEDs to form a multi-layered stacked OLED. The structure of this multi-stacked OLED is similar to those described in U.S. Pat. No. 5,703,436, hereby incorporated by reference. The following illustrative example speaks in terms of OLEDs described in the first embodiment of the current disclosure, but it should be understood that any of the OLEDs including a TiN anode structure may be used to form the stacked OLEDs of the present embodiment.

A multi-stacked OLED of this embodiment includes a substrate, a first OLED, includinga a TiN layer formed over the substrate, an organic emmissive structure, including α-NPD and Alq$_3$, formed over the TiN layer, and a Mg—Ag layer formed over the organic emmissive structure, and a second OLED of the same structure except the TiN layer is formed over the Mg—Ag layer of the first OLED. In addition to stacking two OLEDs of the present invention, a third OLED including a TiN anode could be added to this structure. It should also be noted that different types of OLEDs could be stacked, e.g. a combination of OLEDs with TiN anodes and without TiN anodes.

Fourth Embodiment

Another embodiment of the present invention includes forming TiN anode OLEDs with substantially transparent cathodes. In this embodiment the cathode material is substantially transparent and depending on the desired use for the OLED, the TiN anode could be transparent or opaque (greater than approximately 500 Å). As incorporated above, U.S. Pat. No. 5,703,436 describes a process for forming transparent Mg—Ag cathodes.

TABLE 3

| Nitride | Homogeneity range[a] 1-z at 1700 K | Structure (Bravais lattice) | Lattice parameter (room temp.) (nm) | Density (g cm$^{-3}$) | Color | Microhardness (room temp.) (GPa) | Melting point[b] (K) |
|---|---|---|---|---|---|---|---|
| TiN$_{1-g}$ | 0.50 | fcc | 0.4215 | — | Metallic gray | 23 | — |
| | 1.00 | | 0.4242 | 5.39[c] | Golden yellow | 17 | 3320 |
| ZrN$_{1-z}$ | 0.54 | fcc | 0.4585 | — | Light yellow | — | — |
| | 1.00 | | ~0.4570 | 7.32[c] | Light yellow | 15 | 3250 |
| HfN$_{1-z}$ | 0.70 | fcc | 0.4523 | — | Light yellow | 13.9 (0.94) | — |
| | 1.06 | | 0.4514 | 13.83[e] | Dark yellow | 15.9 (1.00) | 3600 |
| VN$_{1-z}$ | 0.70 | fcc | 0.4060 | 6.05 | Brown yellow | 13.0 | — |
| | 1.00 | | 0.4138 | 6.04 | Brown yellow | 5.7 | 2620 |
| NbN$_{1-g}$ | 0.84 | fcc | 0.4380 | 8.24 (0.92) | Pale yellow | 13.0 | — |
| | 1.00 | | 0.4392 | 8.18 (0.95) | Pale yellow | 11.0 | —[d] |
| TaN$_{1-x}$ | 0.72 (2200 K) | fcc | 0.4345 | — | — | — | — |
| | 1.00 | | 0.4328 | 15.9[c] | Gray yellow | 32 | —[d] |
| TaN | >0.99 | hex | $^a$0.5190 | 14.3 | Dark gray | 11 | — |
| | 1.00 | | $^c$0.2911 | — | — | — | —[d] |
| CrN | >0.97[e] | fcc | 0.4148 | 6.14 | Gray brown | 11 | — |
| | 1.00 | | — | — | — | — | 1300[d] |
| Cr$_2$N | 0.31[e] | hcp | $^a$0.4750$^g$ $^c$0.4430$^g$ | 6.51 | Gray | 12$^g$ | — |
| | 0.50 | | $^a$0.4796 $^c$0.4470 | — | — | 14[b] | 1800 |
| MoN$_{1-g}$ (Mo$_2$N) | 0.40 | fcc | 0.4139 | — | — | — | — |
| | 0.54 (1200 K) | | 0.4162 | 9.48[c] | Gray | 17[b] | — |
| MoN | — | hex | $^a$0.5745 $^c$0.6122 | 8.1 9.1[c] | Gray Gray | — | — |

TABLE 3-continued

| Nitride | Heat conduct.[b] room temp. (Wm⁻¹ K⁻¹) | Thermal exp. coefficient at 1000 K (10⁶ K⁻¹) comp. (1-x) | Elect. resistance (room temp.)[b] (μΩ cm) | Supercond. transition temp $T_c$ (K) comp. (1-g) |
|---|---|---|---|---|
| TiN$_{1-g}$ | — | — | — | <1 |
|  | 29 | 9.4 (0.95) | 25 | 5.8 |
| ZrN$_{1-z}$ | — | — | — | — |
|  | 11 | 8.2–9.1 (0.92) | 21 | 10.47 |
| HfN$_{1-z}$ | — | — | — | 8.7 (0.85) |
|  | 11 | 8.6 | 33 | 6.92 |
| VN$_{1-z}$ | — | 11.0 | — | 2.7 (0.76) |
|  | 11 | 10.8 | 65 | 8.9 |
| NbN$_{1-g}$ | — | 9.5 (0.92) | — | 13.8 (−0.84) |
|  | 3.8 | 10.2 (0.95) | 60 | 17.2 |
| TaN$_{1-x}$ | — | — | — | — |
|  | — | 8.0 | — | 8.9 (0.94) |
| TaN | — | — | — | — |
|  | 9.54 | — | 128 | — |
| CrN | 11.7 | 2.3 | — | —[f] |
|  | — | — | 640 | — |
| Cr$_2$N | — | — | — | —[f] |
|  | — | — | 81 | — |
| MoN$_{1-g}$ (Mo$_2$N) | — | — | — | — |
|  | — | 9.3 | — | −5.08 |
| MoN | — | — | — | 15.1 |

[a]Nitrogen-rich phase boundary depends on nitrogen pressure.
[b]Exact composition unknown, probably close to 2:1 (CrN$_{1-g}$, MoN$_{1-z}$) or 1:1 (all others) stoichiometry.
[c]X-ray density.
[d]Decomposes.
[e]Calculated.
[f]Not superconducting.
[g]Exact composition unkown.

Conclusion

In addition to the TiN used in the embodiments, other metal nitrides can be used as conductive nitride material in the present invention. For example, Table 3 lists a number of nitrides which could be used as anode material in OLEDs. In particular, ZrN is a refractory metallic conductor, with similar characteristics to TiN.

The present invention provides monochromatic and multicolor light emitting devices with high brightness and efficiency. Those with skill in the art may recognize various modifications to the embodiments of the invention described and illustrated herein. Such modifications are meant to be covered by the spirit and scope of the appended claims.

What is claimed is:

1. An organic light emitting device (OLED) comprising a conductive nitride electrode wherein
    the conductive nitride electrode comprises TiN;
    wherein the OLED is selected from the group consisting of single layer polymer, multi-layer polymer, single heterostructure, and double heterostructure; and
    wherein the OLED further comprises a transparent cathode comprising a layer of ITO and a layer of metal or metal alloy.

2. The OLED of claim 1, wherein the TiN thickness ranges from approximately 40–180 Å.

3. The OLED of claim 1, wherein an organic film comprises first and second layers.

4. The OLED of claim 1, wherein the first organic layer is an electron transporting layer, and the second organic layer is electroluminescent and a hole transporting layer.

5. The OLED of claim 1, wherein the first organic layer comprises 4,4'-Di(phenyl-α-napthylamino)biphenyl (α-NPD) and the second organic layer comprises aluminum-tris(8-quinoloxide) (Alq$_3$).

6. The OLED of claim 1, wherein the electrode sheet resistance is approximately less than 400 Ω/□.

7. The OLED of claim 1, wherein the corrected external quantum efficiency is approximately 0.60% or higher.

* * * * *